US012668897B2

(12) United States Patent
Gallo et al.

(10) Patent No.: US 12,668,897 B2
(45) Date of Patent: Jun. 30, 2026

(54) PRINTED MXene COILS ON TEXTILES FOR WIRELESS CHARGING AND ENERGY STORAGE

(71) Applicant: Accenture Global Solutions Limited, Dublin (IE)

(72) Inventors: Eric Michael Gallo, Moretown, VT (US); Corey Alexander Inman, Santa Barbara, CA (US); Lavinia Andreea Danielescu, Seattle, WA (US)

(73) Assignee: ACCENTURE GLOBAL SOLUTIONS LIMITED, Dublin (IE)

( * ) Notice: Subject to any disclaimer, the term of this patent is extended or adjusted under 35 U.S.C. 154(b) by 127 days.

(21) Appl. No.: 18/639,895

(22) Filed: Apr. 18, 2024

(65) Prior Publication Data

US 2025/0327219 A1 Oct. 23, 2025

(51) Int. Cl.
| | |
|---|---|
| D03D 1/00 | (2006.01) |
| D06M 11/58 | (2006.01) |
| D06M 11/74 | (2006.01) |
| H01F 5/00 | (2006.01) |
| H01F 27/28 | (2006.01) |
| H01F 41/04 | (2006.01) |
| H05K 1/189 | (2026.01) |

(52) U.S. Cl.
CPC .......... D03D 1/0082 (2013.01); D06M 11/58 (2013.01); D06M 11/74 (2013.01); H01F 5/003 (2013.01); H01F 27/2804 (2013.01); H01F 41/041 (2013.01); H05K 1/189 (2013.01); D10B 2401/18 (2013.01)

(58) Field of Classification Search
CPC ... D03D 1/0082; H01F 5/003; H01F 27/2804; H01F 41/041; H05K 1/189; D06M 11/58; D06M 11/74; D06M 11/83
See application file for complete search history.

(56) References Cited

U.S. PATENT DOCUMENTS

2020/0381167 A1* 12/2020 Moriki ................ H01F 27/2804

FOREIGN PATENT DOCUMENTS

CN 111312491 A * 6/2020 ............. H01F 38/14

OTHER PUBLICATIONS

N. J. Grabham, Y. Li, L. R. Clare, B. H. Stark and S. P. Beeby, "Fabrication Techniques for Manufacturing Flexible Coils on Textiles for Inductive Power Transfer," in IEEE Sensors Journal, vol. 18, No. 6, pp. 2599-2606, Mar. 15, 2015, 2018, doi: 10.1109/JSEN. 2018.2796138 (Year: 2018).*

(Continued)

*Primary Examiner* — Larissa Rowe Emrich
(74) *Attorney, Agent, or Firm* — Mannava & Kang, P.C.

(57) ABSTRACT
A system and method of manufacturing MXene-based coils on textile substrates. The system and method enable wireless charging of embedded devices in textiles, including energy storage, sensors, and wireless charging coils, removing the need for rigid physical connections. The systems manage print content by deposition of MXene ink compositions with a custom-generated coil design comprising specific geometric parameters that are configured to target required performance targets. Such an approach allows for the augmentation of e-textiles with sufficient energy and/or data transmission capacities so as to support the use of a wide range of smart devices and applications.

19 Claims, 9 Drawing Sheets

(56) References Cited

OTHER PUBLICATIONS

S. Uzun, M. Schelling, K. Hantanasirisakul, T. S. Mathis, R. Askeland, G. Dion, Y. Gogotsi, Additive-Free Aqueous MXene Inks for Thermal Inkjet Printing on Textiles. Small 2021, 17, 2006376. https://doi.org/10.1002/smll.202006376 (Year: 2021).*

"CN111312491_Machine Translation" is a machine translation of CN-111312491-A. (Year: 2020).*

* cited by examiner

PRINTED MXene COILS ON TEXTILES FOR WIRELESS CHARGING AND ENERGY STORAGE

TECHNICAL FIELD

The present disclosure generally relates to a method and system for manufacturing wireless charging coils on textiles. More specifically, the present disclosure relates to a system and method for manufacture of textile-based devices that enable wireless charging using MXene inks.

BACKGROUND

With the demand for portable and smart devices in modern daily lives, skin mountable and wearable electronic devices have become increasingly desirable. "Smart textile"-based devices are projected to play a vital role in wearable electronics, contributing in the areas of energy harvesting to energy storage, sensors, real-time monitoring of health and biomedical devices, personal thermal management, and even garment comfort. Wearable electronic devices often have close contact with the human body that is soft and movable, and hence, stretchability and mechanical deformability can be understood to represent key aspects that should be targeted when developing smart textile-based wearable devices. Current electronic components are uncomfortable to wear against skin. Electronic components are currently too rigid and do not blend in with textiles to provide a soft, flexible feel that integrates with the surrounding areas of the textile.

With respect to textiles and the manufacture of energy coils integrated into said textiles, current techniques fail to provide power supply options by which textile-based electronics ("e-textiles") can be charged without hard physical connections.

There is a need in the art for a system and method that addresses the shortcomings discussed above.

SUMMARY

Powering textile-based systems remains a significant challenge. Integrating power supply modules inside textile products can affect a wearer's comfort, as well as the garment's long-term durability, shelf life, washability. The proposed systems and method overcome these challenges by providing techniques for the deposition of MXene ink-based coils onto textile substrates by printing. These printed coils make possible wireless charging of embedded devices in textiles that can serve as energy storage, health/activity monitors or sensors, and to facilitate data transmission while removing the need for rigid physical connections to the textile. The augmentation of garments with custom printed coils overcomes a major hurdle in textile electronics and wearables by removing the necessity for hard electrical connectors within these systems.

By modulating various geometrical parameters associated with the printed coil design, the performance of the coils can be targeted to serve a wide range of use-cases. For example, printed coils can enable wireless energy transfer that would allow clothing such as a smart jacket to recharge on a standard coat rack or hanger. In another example, such custom print coils could also allow a user to recharge their cell phone wirelessly using energy stored in a sweater or jacket, or facilitate wireless monitoring of hospital patients using only their gowns, with wireless power transmitted by the bed sheets. The technology can also offer bidirectional information transfer, allowing wireless charging and readout of textile-based devices. This could enable easy large-scale fabrication of a smart running shirt that can be charged wirelessly while functioning as a health monitoring system with textile-based energy storage that would power the monitors over the course of a run. The shirt can be thrown on a mat or washed and placed in a drawer where the wireless connection provided by the printed coils could both recharge the shirt and download the stored data from the run. Thus, there are a large set of potential application areas for this technology including healthcare and high-performance athletic wear.

In one aspect, the disclosure provides a wearable device that serves as a wireless charging coil, sensor, or energy storage system. The wearable device includes a first textile substrate, and an MXene ink composition printed onto the first textile substrate having a coil geometry which includes at least two coil loops, and one or more printing passes.

In another aspect, the disclosure provides an e-textile garment that enables wearers to wirelessly power an electronic device or charge an energy storage system. The e-textile garment includes a first textile substrate; and an MXene ink composition printed onto the first textile substrate having a coil geometry which includes at least two coil loops, and one or more printing passes.

In another aspect, the disclosure provides a method of manufacturing flexible wireless electronics on textiles. The method includes a first operation of depositing, using a textile-based manufacturing system, a first pass of an MXene ink composition directly onto a first textile substrate to create a coil with a first coil geometry, and a second operation of depositing multiple additional passes of the MXene ink composition onto the coil to decrease a resistance of the coil with each additional pass. In addition, a third operation includes thereby fabricating a first functional module that can either wirelessly power an electronic device, charge an energy storage system, or provide wireless data transfer to an electronic device.

Other systems, methods, features, and advantages of the disclosure will be, or will become, apparent to one of ordinary skill in the art upon examination of the following figures and detailed description. It is intended that all such additional systems, methods, features, and advantages be included within this description and this summary, be within the scope of the disclosure, and be protected by the following claims.

While various embodiments are described, the description is intended to be exemplary, rather than limiting, and it will be apparent to those of ordinary skill in the art that many more embodiments and implementations are possible that are within the scope of the embodiments. Although many possible combinations of features are shown in the accompanying figures and discussed in this detailed description, many other combinations of the disclosed features are possible. Any feature or element of any embodiment may be used in combination with or substituted for any other feature or element in any other embodiment unless specifically restricted.

This disclosure includes and contemplates combinations with features and elements known to the average artisan in the art. The embodiments, features, and elements that have been disclosed may also be combined with any conventional features or elements to form a distinct invention as defined by the claims. Any feature or element of any embodiment may also be combined with features or elements from other inventions to form another distinct invention as defined by the claims. Therefore, it will be understood that any of the features shown and/or discussed in the present disclosure may be implemented singularly or in any suitable combination. Accordingly, the embodiments are not to be restricted except in light of the attached claims and their equivalents. Also, various modifications and changes may be made within the scope of the attached claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DESCRIPTION OF EMBODIMENTS

Figure 1:
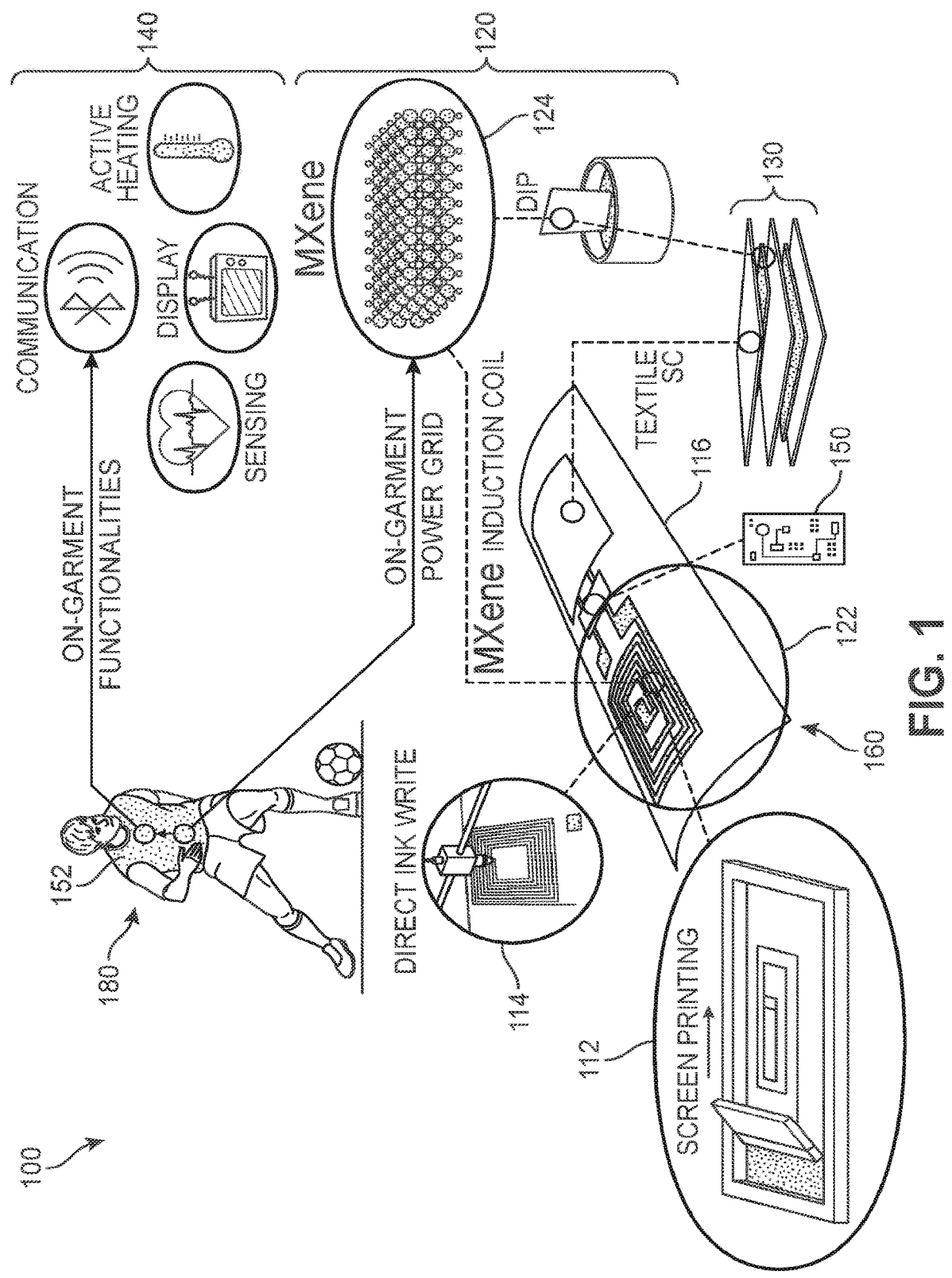
FIG. 1 is a schematic diagram of a customized manufacturing process for augmentation of e-textiles with MXene-based wireless electronics, according to an embodiment.

A wearable technology typically integrates electronic functionality into body accessories or apparels (textiles). Textiles are ubiquitous and are by necessity worn everywhere. This makes them the ideal application for wearable technologies. However, these accessory devices are typically produced using existing high throughput microelectronics manufacturing processes and materials, which are not ideal for electronic integration on garments or textiles in general. Thus, the current market for wearable devices predominantly consists of smart accessory devices in the form of wristbands and wristwatches. It can be appreciated that such hard or rigid components are limited in their applications.

There is a growing movement toward the integration of electronics with traditional textile garments to produce electronic textiles (e-textiles) to address these deficiencies. As a general matter, e-textiles are textiles that incorporate one or more bespoke electronic functionalities for sensing (biometric or external), displaying information, communications (usually wireless), power transmission, and/or an interconnect for sensors and other devices within a fabric. E-textile applications include healthcare/medical monitoring and stimulation of bio-electric body signals, protective garments for military and industrial personnel, e-textile devices for infotainment in fashion and entertainment, wearable energy storage devices, and harvesters for powering mobile sensor devices or other wearable technology.

Retaining the textile breathability, flexibility, maintaining appearance, and "washability" after electronic integration are significant challenges to e-textile adoption. Furthermore, integrated devices and materials must be robust enough to outlast the lifetime of their intended application, while delivering reliable electrical performance. The power supplies are also very critical for e-textile devices. Many wearable accessory devices are powered from inflexible batteries which increase the weight of the devices and are required to be recharged or replaced regularly. Similarly, emerging e-textile prototypes are typically powered from rigid batteries which are incompatible with the flexibility and washing requirements of textile integration, and further require a hard-to-soft connection that has diminished durability.

Described herein are systems, methods, devices, and other techniques for printing and manufacture of textile-based power sources, energy storage, and wireless power transfer solutions. In some embodiments, the proposed manufacturing techniques make possible the transfer of current into a textile-based energy storage without requiring any hard to soft interfaces or junctions in the textile. In other words, the proposed solutions enable wireless charging to be implemented on fabric, removing the need for physical connectors to charge energy storage or power devices. In addition, in some embodiments, the augmented fabric can deliver wireless power to wearable devices. In different embodiments, the proposed systems leverage the properties of MXene for printing on fabric to create complete textile based wearable systems that facilitate wireless energy transfer to a textile receiver.

As will be discussed in greater detail below, in different embodiments, a variety of manufacturing methods are used to create the MXene-based wireless charging coils on fabric. In different embodiments, the design enables fabric-based wireless charging coils to receive and/or transmit wireless power, allowing a sweater, coat, curtain, couch cover, or any fabric to be functionalized to receive and transmit power or information wirelessly. In some embodiments, the system incorporates aqueous solutions of MXene that can be dispensed through standard printing methods to create wireless charging coil patterns on fabrics (e.g., direct ink write printing, ink jet printing, screen printing, etc.). These wireless charging coils can be custom designed for a wide set of wireless frequencies, such as those used by current wireless charging standards and tuned to deliver desired voltage and power to embedded electronics. In one non-limiting example, the system enables wirelessly charging of a textile supercapacitor, where the MXene-based wireless charging coil can receive energy from an-off-the shelf wireless power transmitter, and apply to an MXene supercapacitor to charge.

As a general matter, an ink composition employed by the systems herein can include a 2D material and a solvent. In different embodiments, the ink composition can include a form selected from the group consisting of a colloidal particle, a colloidal dispersion, a colloidal suspension, a 2D nanomaterial, a nanomaterial dispersion, a nanomaterial suspension, and any combination thereof. In some embodiments, the ink composition is a colloidal dispersion. Furthermore, in some embodiments, the 2D material is a 2D nanomaterial. As used herein, the term "nanomaterial" refers to a material having a size measured on the nanometer scale. For example, nanomaterials are usually considered to be materials with at least one external dimension that measures 100 nanometers or less or with internal structures measuring 100 nm or less. In the case of MXenes, their x and y dimensions can be 1000s of nanometers but their z direction is only a few nanometers.

In one embodiment, the 2D material is electrically conductive. More specifically, in some embodiments, the 2D material includes an "MXene" composition, referring to a family of 2D carbides and nitrides. MXenes have a chemically active surface that is compatible with natural fibers, redox active, and has a high conductivity. In some embodiments, the MXene composition includes a transition metal carbide. In some embodiments, the MXene composition includes a transition metal nitride. In another embodiment, the MXene composition includes a transition metal carbonitride. In some embodiments, the MXene composition is of a general formula $M_{n+1}X_nT_x$ (n=1, 2, or 3), where M denotes a transition metal, X is carbon and/or nitrogen, and $T_x$ denotes a surface functional group. In some embodiments, M is selected from a group consisting of Ti, Cr, V, Mo, Zr, Sc, Mn, Nb, Y, W, Ta, and Hf. In some embodiments, $T_x$ is selected from a group consisting of =O, =OH, and =F. In some embodiments, $T_x$ is selected from a group consisting of =O, =OH, =Cl, =N, and =F. In some embodiments, the MXene composition is $Ti_3C_2T_x$ and $T_x$ denotes a surface functional group. In some embodiments, $T_x$ is selected from a group consisting of =O, =OH, and =F. In some embodiments, $T_x$ is selected from a group consisting of =O, =OH, =Cl, =N, and =F.

As used herein, the term "surface functional group" refers to a specific group of atoms or bonds responsible for a characteristic chemical property or reaction. In general, additive-free (referring to the absence of any additive surfactants or binary-solvent systems) MXene inks can be integrated into textiles to form strong, flexible, and functional coatings for wearable electronics.

For purposes of introduction, a schematic diagram of one embodiment of a print-based manufacture process 100 (or process 100) for e-textile augmentation is presented in FIG. 1. In different embodiments, the process 100 can begin with an additive-free MXene ink composition 124 being used to print functional module in the form of an induction coil 122 onto a textile substrate 116. In different embodiments, manufacturing can be performed by one of a range of available printing or textile-production apparatuses. In different embodiments, manufacturing can involve what is known as an additive manufacturing process, such as material extrusion (direct ink writing (DIW) and fused deposition modelling (FDM)), material jetting (inkjet printing), flexographic, offset, gravure printing, dispenser printing, and screen printing, for electronic integration on textiles using electrically conductive inks. For example, screen printing that utilizes a stencil with a pre-patterned design and a mesh screen to transfer ink onto a target substrate through physical contact using a squeegee, gravure printing involves direct ink transfer from engraved micrometer-sized recessed cells of the cylindrical roller to the substrate with the aid of an impression cylinder, and inkjet printing uses either a thermal or piezoelectric transducer to eject tiny droplets of ink to create high-resolution patterned images. In some embodiments, other textile-based manufacturing processes can be used to manufacture the charging coil such as embroidery, knit (e.g., in cases where the MXene is applied directly to the fiber rather than the fabric), spraying of MXene onto the textile, or stenciling of the MXene ink pattern. For purposes of this application, a textile manufacturing system refers to any of the above-mentioned textile manufacturing processes.

It should be understood that the term "additive" when used in printing is distinct from the same term "additive" when describing the MXene ink composition. As a general matter, screen printing is most suitable for high throughput roll to roll manufacturing process and is currently a standard process in the textiles industry. Other stresses such as bending, abrasion, and flexing also degrade these conductors. Thus, in order to address these and other challenges described herein, the proposed systems and methods offer an option by which additive-free MXene-based wireless charging coils, micro-supercapacitors (MSCs), large area supercapacitors, sensors, and other coils for wireless charging and data transmission can be directly printed onto textiles using additive manufacturing technologies. For purposes of this application, these wireless electronic components can also be referred to as functional modules. In FIG. 1, for purposes of illustration, the use of a screen printer 112 and a DIW printer 114 is depicted for purposes of manufacturing a first functional module (the induction coil 122) on the textile substrate 116. In addition, directly adjacent to the induction coil 122 is a textile supercapacitor 130 that comprises an assembly 120 of electrodes dip-coated in the MXene ink composition 124. In different embodiments, the supercapacitor 130 can serve as energy storage that can be wirelessly charged via the induction coil 122.

As shown in FIG. 1, the disclosed fabrication techniques enable the manufacture of augmented e-textiles 160 that include printed electronic components such as a garment energy grid that can provide energy storage options for functionalities 140 ranging from sensing, presentation of information, communication, temperature regulation, and biomedical devices, among others. In particular, these functionalities 140 can be implemented in wearable fabric garments 152 for use by everyday consumers 180. Furthermore, while conventional MXene print methods have required pre-treatments in order to make possible patterned depositions ("patterning") of the ink, the proposed embodiments can be used to produce complex, dense wireless charging coil structures, traces, and other intricate patterns on fabric without a pre-treatment step by optimizing the parameters by which such patterns are formed. Thus, in different embodiments, the manufacturing techniques described herein significantly broaden the textile choices, manufacturing methods, wireless charging coil designs, and supporting circuitry that can be manufactured for functional fabric-based wireless energy transfer systems.

It can be appreciated that a successful adoption of e-textiles will require reliable wireless connectivity for wearable applications. This is because, for most wearable applications, conventional batteries are not ideal because they require periodic replacement or charging, and typically have a bulky form factor. Their physical connectors to e-textiles are also challenging and problematic. Still, batteries are standard power supplies for portable devices. As can be appreciated herein, when attached to textiles, traditional batteries significantly alter the property of the textiles because of their inflexibility. Conventional approaches to deliver power supply of e-textile applications are to use standard commercially available capacitors and batteries, for example, super capacitors, coin cell and AA/AAA batteries. However, these off-the-shelf power supplies are typically rigid, bulky and are incompatible to remain or maximize the texture of the fabrics, at the same time, restricting the flexibility and breathability of the garment and being obtrusive for the wearer.

In contrast, wireless power transfer (WPT) and RF energy harvesting represent methods of reliably charging or powering textile-based systems. From an e-textile perspective, the coils are the most area consuming component in the system and therefore need to be implemented using textile or flexible conductors. The proposed systems make possible a direct-to-print of coils into textiles for integration of energy storage into the textile using supercapacitors while maintaining the textile's properties. Supercapacitors are electrochemical energy storage devices that have several advantages over secondary batteries such as fast charging time, higher power density and cycling stability, environmental friendliness, flexibility, and ease of integration into textiles. In e-textiles, supercapacitors can be an alternative to the battery or to supplement the power output of the battery to other electrical components in the e-textile system, or to act as energy reservoirs for energy harvesters. The proposed printed coils offer a high level of electrochemical performance while maintaining a desirable mechanical flexibility under different textile conditions such as abrasion, bending and washing.

Figure 2:
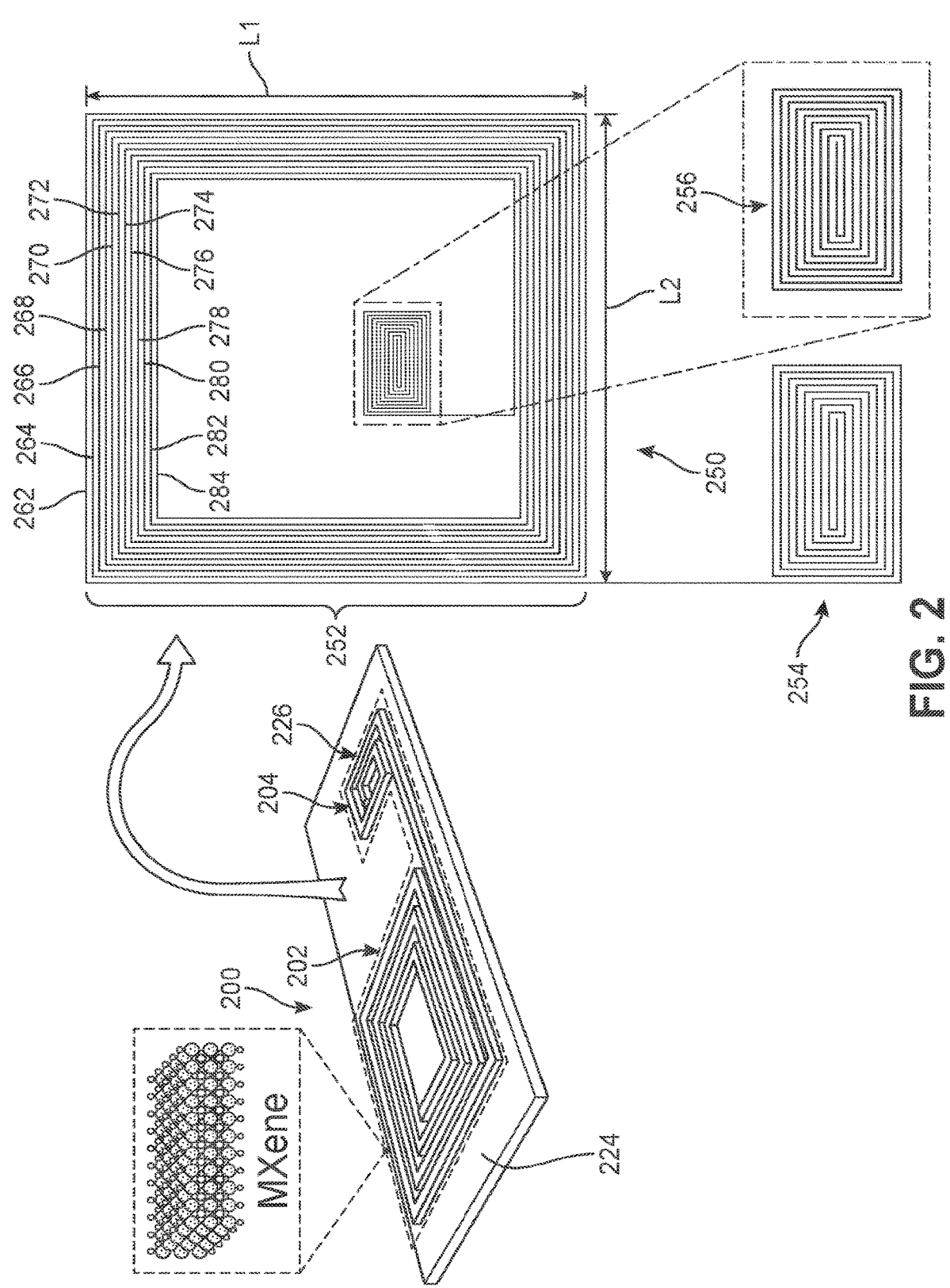
FIG. 2 is a schematic sample design of printed wireless charging assembly, according to an embodiment.

One example of a printed wireless charging assembly ("assembly") 250 is presented in FIG. 2. Simply for purposes of clarity for the reader, the MXene traces are represented as raised in FIG. 2. However, it should be appreciated that once the MXene ink is applied to the textile substrate, the ink can soak into the fabric, providing a substantially smooth, uninterrupted outer surface.

As shown in FIG. 2, in different embodiments, the assembly 250 is printed on a textile substrate 224 to form an augmented e-textile 200. In different embodiments, the assembly 250 can initially be designed and stored as a schematic PCB file (e.g., CAD or .grb files) defining a primary coil 252 by critical parameters based on characteristics including: (a) pitch, (b) number of turns (MXene strand deposition "loops" comprising the coil) in the primary coil 252, (c) the volume of MXene-based ink comprising the primary coil 252, (d) the total area taken up by the primary coil 252, (e) the length of each turn, (f) the spacing size in the center of the primary coil 252, as well as the gap between the innermost turn of the primary coil 252 and an embedded interior secondary coil 256, and (g) the number of print passes performed over each line. Each of these characteristics thereby corresponds to a geometrical parameter for the functional module.

Furthermore, in some embodiments, the secondary coil 256 can be a printed landing pad that may be sewn into or under a layer of the textile substrate 224, for example via MXene-coated yarn. In this example, the primary coil 252 comprises a 500 um (micrometer) pitch, as well as twelve turns, shown here as a first turn 262, a second turn 264, a third turn 266, a fourth turn 268, a fifth turn 270, a sixth turn 272, a seventh turn 274, an eighth turn 276, a ninth turn 278, a tenth turn 280, an eleventh turn 282, and a twelfth turn 284. In some embodiments, each turn as a whole has an approximately rectangular shape, with a first maximum length L1 on one side and a second maximum length L2. Although the drawings depict rectangular shapes, it should be understood that a wide variety of other shapes can also be manufactured to provide similar functionalities and benefits, including circular coils, rectangles/rectangular coil with rounded edges, elliptical coils, oval coils, among others. In some embodiments, as shown in the FIGS., MXene strand deposition "loops" may be made of a continuous strand formed in a circuitous path forming a coil of concentric loops. In some embodiments, the sewn-in secondary coil may be located within the smallest loop and/or located at the shared center of the loops.

Figure 4:
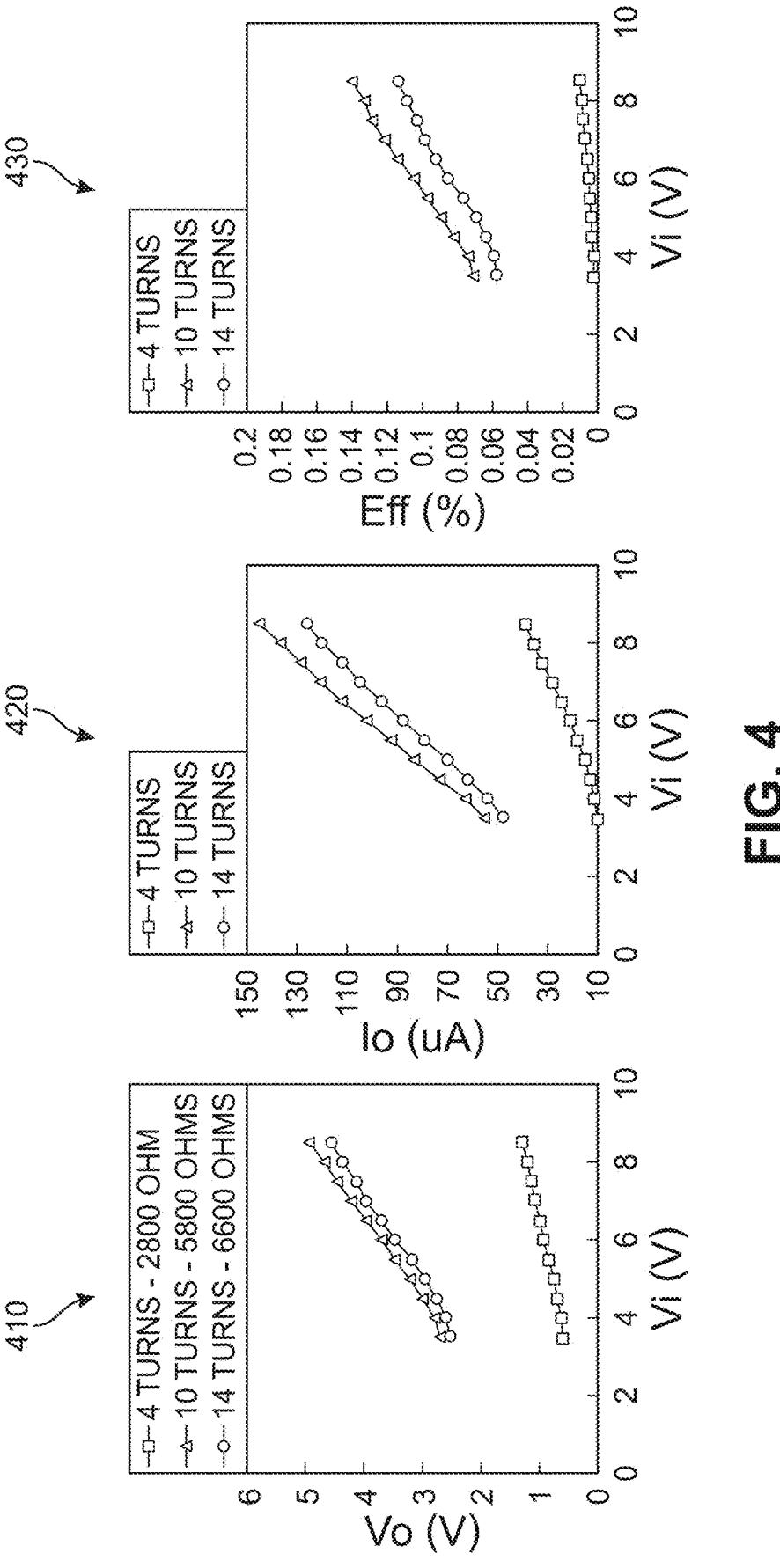
FIG. 4 is a set of three graphs presenting results from functional modules printed on the same textile type while varying the number of turns in the coil, according to an embodiment.

In FIG. 2, each turn is approximately a square shape, so that L1 and L2 are substantially equal. In one example embodiment, the overall dimensions of the primary coil 252 can be 4 cm×4 cm. Each turn comprising the coil is spaced apart from its neighboring turn as they continuously "wrap" or cycle around one another. However, as revealed by experimental testing (e.g., see FIG. 4), while the number of turns can affect coil performance, the relationship can be complex, along with inter-strand distance, and width of each strand that is deposited.

In some embodiments, at the innermost turn (here, twelfth turn 284), before completing a final loop the printer travels to an interior space 292 to connect the primary coil 252 to the sewn-in secondary coil 256. At the other end, printing of the outermost turn (here, first turn 262) can extend in a vertically downward direction along one side to connect to a printed landing pad 254. As shown in the schematic isometric view of the augmented e-textile 200, a printed electronic component 226 deposited on the textile substrate 224 can include a wireless charging coil 202 based on the primary coil 252 as well as an MSC 204 based on the printed landing pad 254. In different embodiments, the landing pads (e.g., secondary coil 256 and/or landing pad 254) can be associated with a 250 um pitch.

The ability to manufacture the assembly 250 in a direct-to-textile offers great advantages over other technologies. For example, direct-to-textile fabrication permits the implementation of MXene functionalities into many different fabrics, such as knit, yarns, silk, wool, or a diverse range of other woven and non-woven materials without relying on a hard or rigid substrate that must be sewn or attached to the textile. Instead, for example, these potentially life-changing electronics can be screen printed directly onto shirts, pants, and other garments or articles of apparel.

Figure 3:
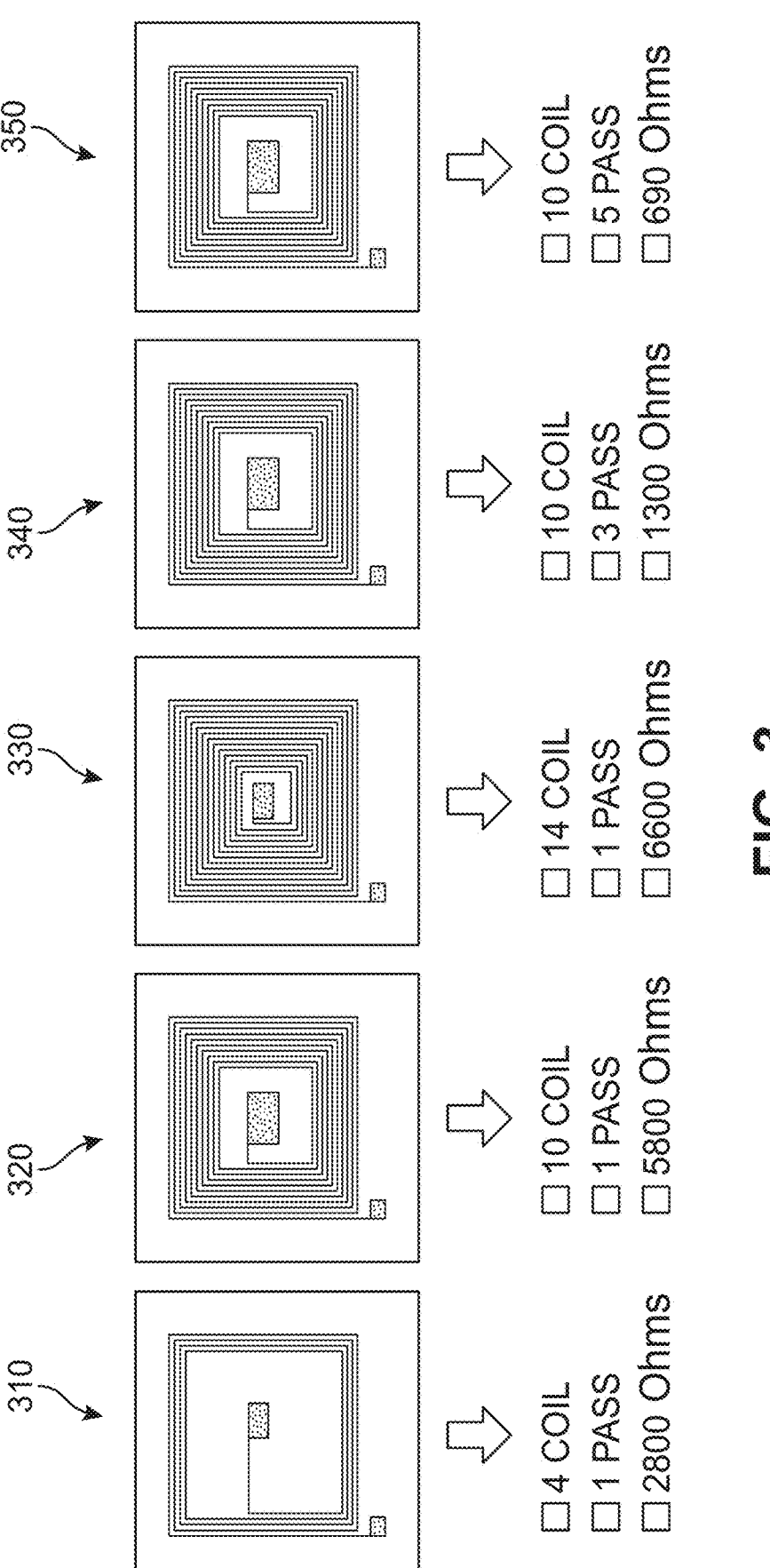
FIG. 3 is a diagram depicting direct-to-textile print samples manufactured using the disclosed techniques that were tested for resistance, according to an embodiment.

As noted earlier, the performance of the printed assembly can be improved—in some cases by a significant degree—by adjusting parameters corresponding to specific characteristics of the print output. FIG. 3 depicts a set of direct-to-textile print samples manufactured using the disclosed techniques that were tested for resistance. The set includes a first coil assembly 310 printed on a first patch of fabric, a second coil assembly 320 printed on a second patch of fabric, a third coil assembly 330 printed on a third patch of fabric, a fourth coil assembly 340 printed on a fourth patch of fabric, and a fifth coil assembly 350 printed on a fifth patch of fabric, where each patch fabric comprises the same textile material. As presented in values listed below each sample, as the number of coils turns increased from four in the first coil assembly 310, to ten in the second coil assembly 320, there was a corresponding increase in resistance from 2800 Ohms to 5800 Ohms. Similarly, as the number of turns was again increased from ten in the second coil assembly 320 to fourteen in the third coil assembly 330, there was a corresponding increase in resistance from 5800 Ohms to 6600 Ohms.

In addition, the tests measured resistance levels for coils with the same number of turns but different number of passes (e.g., the number of times the ink is laid down on the same line, or thicker deposition). A relationship by which an increased number of passes reduced the resistance was observed. For example, as presented in values listed below each sample, while the number of turns was held constant at ten, as the number of passes increased from one pass in the third coil assembly 330 to three passes in the fourth coil assembly 340, there was a corresponding decrease in resistance from 5800 Ohms to 1300 Ohms. Similarly, as the number of passes was again increased from three passes in the fourth coil assembly 340 to five passes in the fifth coil assembly 350, there was a corresponding decrease/reduction in resistance from 1300 Ohms to 690 Ohms. Thus, at ten turns, the resistance in a coil can nevertheless be dropped five to tenfold by adding one or two more passes. In other words, the manufacturing parameters can be selected to optimize the overall performance of the coil, where if a larger number of turns is desirable for purposes of efficiency, the number of passes can also be increased to ensure the resistance does not exceed some designated threshold.

FIG. 3 showed how electrical performance could be quantified using resistance measurements and modulated based on the number of turns and passes. Some data on the performance of these augmented e-textiles is now presented in a series of graphs in FIG. 4 characterizing results from functional modules/electronic components printed on the same textile type using the proposed techniques. The data presented in FIG. 4 was collected following steps comprising: (1) A DC power supply ($V_{in}$) supplied a set voltage (which had a corresponding current Iin) to transmitter module that converted the DC power to AC in a commercially available, copper induction coil; and (2) The AC power was then transferred wirelessly to an MXene coil and fed through a full bridge rectifier, after the rectification the voltage and current were then measured as $V_{out}$ and $I_{out}$.

A better understanding of the effect of each print parameter with respect to the printed lines will allow users to select appropriate process parameters for electronic functional performance. A first graph 410 depicts the relationship between the number of turns across three coil assemblies and their voltage capacities. A second graph 420 depicts the relationship between the number of turns across three coil assemblies and their current transmission capacities. A third graph 430 depicts the relationship between the number of turns across three coil assemblies and their overall percent efficiency.

Referring to the first graph 410, data collected after DC Vin was converted to AC, and then coupled to the MXene coil which is then converted back to DC and measured as $DC_{out}$ is presented. It can be observed that, to a certain extent, as the number of turns was increased, the capacity of the printed component to wirelessly pass DC voltage in→DC voltage out was improved. For example, at four turns, the voltage out remains relatively low (under 2 volts) even as voltage in is increased to eight and higher. There is a more profound linear relationship when the turns are increased, whereby ten turns lead to a significant jump in the voltage out that is measured relative to four turns. However, with turns greater than ten—such as fourteen—there is actually a slight drop in performance. Thus, it can be appreciated that there may be diminishing returns in voltage output upon reaching a certain number of turns in the coil.

Similarly, referring to the second graph 420, it can be observed that, to a certain extent, as the number of turns was increased, the capacity of the printed component to carry current based on voltage in was improved. For example, at four turns, the current out remains relatively low (under 40 microamps) even as voltage in is increased to eight and higher. There is a more profound linear relationship when the turns are increased, whereby ten turns lead to a significant jump in the current out that is measured relative to four turns. However, with turns greater than ten—such as fourteen—there is actually a slight drop in performance. Thus, it can be appreciated that there may be diminishing returns in current output upon reaching a certain number of turns in the coil.

Finally, referring to the third graph 430, it can be observed that, to a certain extent, as the number of turns was increased, the overall efficiency of the component was improved. For example, at four turns, the efficiency value remains relatively low and even (under 0.02%) even as voltage in is increased to eight and higher. There is a more profound linear relationship when the turns are increased, whereby ten turns lead to a significant jump in the efficiency that is measured relative to four turns. However, again with turns greater than ten—such as fourteen—there is actually a slight drop in performance. Thus, it can be appreciated that there may be diminishing returns in efficiency upon reaching a certain number of turns/loops in the coil.

Figure 5:
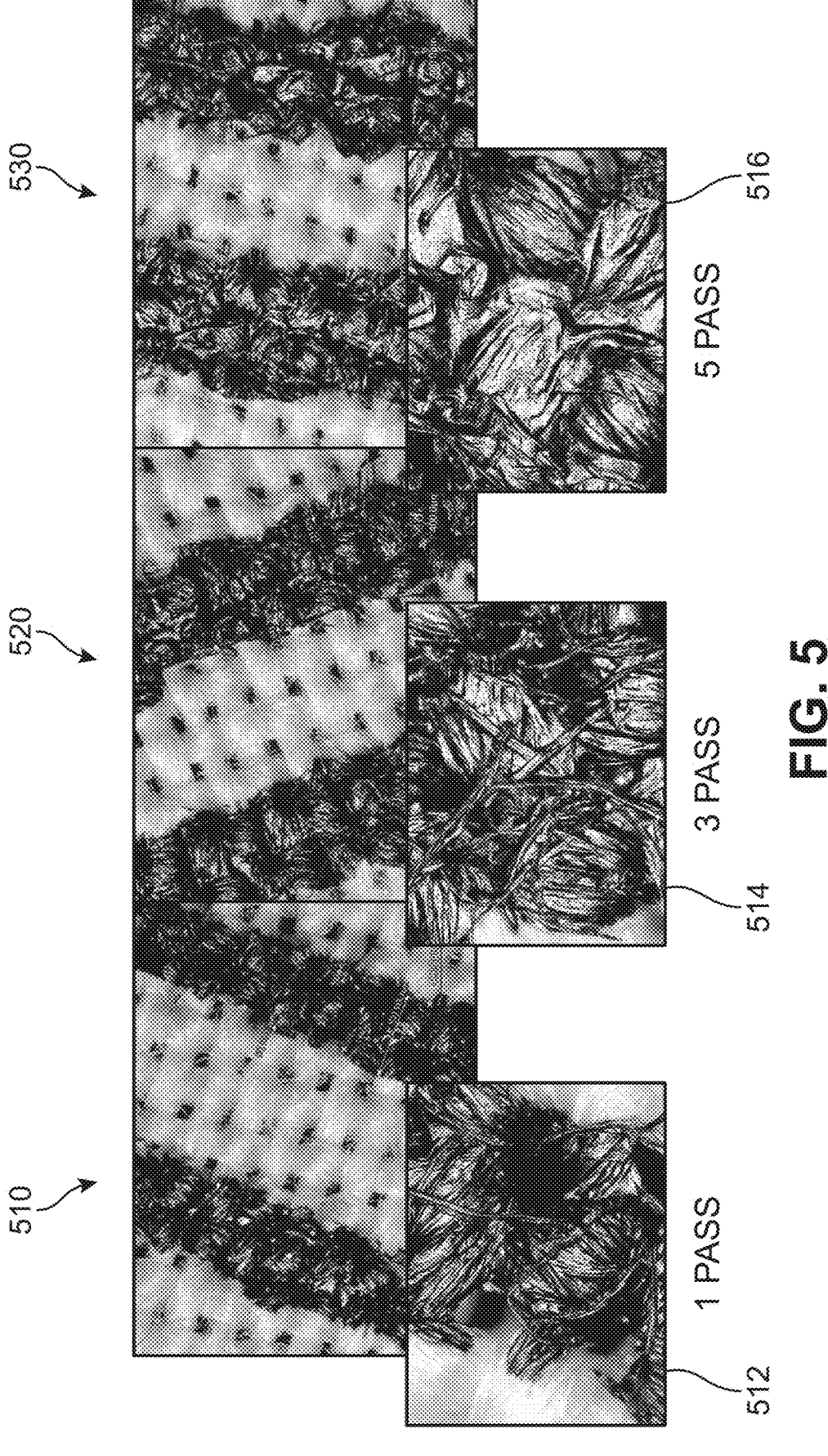
FIG. 5 presents three images of sample outputs of coils printed on a textile substrate with a varying number of print passes, according to an embodiment.

In order to better illustrate the proposed manufacturing techniques, FIG. 5 depicts a series of photograph images in which an MXene ink composition is deposited on a woven textile. A first photograph 510 shows a textile on which one print pass with the ink has been performed in a coil, with a first magnified view 512 providing further detail of the texture and thickness of the resulting coil (comprising 10 turns, not shown here). A second photograph 520 shows the same textile when three print passes have been performed, where a second magnified view 522 reveals a corresponding increase in thickness, spread, and integration with the textile. A third photograph 530 shows the same textile when five print passes are performed, with a third magnified view 532 revealing a greater smoothness, uniformity, and continuity to the line, as well as the greater thickness.

Figure 6:
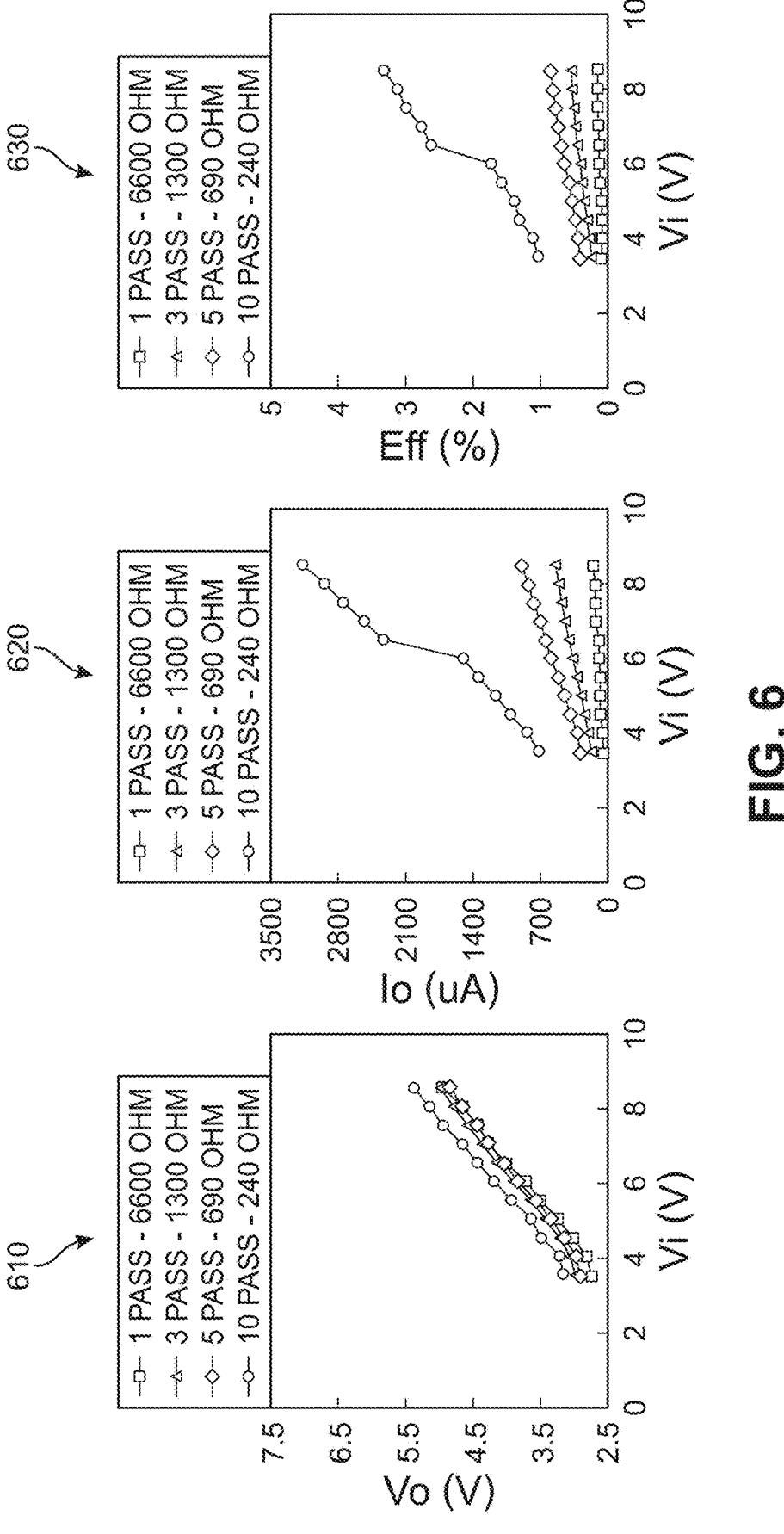
FIG. 6 is a set of three graphs presenting results from functional modules printed on the same textile type while varying the number of print passes, according to an embodiment.

The effect of the number of passes for each turn of the coil can be better appreciated by reference to a set of graphs provided in FIG. 6 which characterizes experimental data based on the augmented e-textile shown in FIG. 5, where the printed coil includes ten turns. The data presented in FIG. 6 was collected following steps comprising: (1) A DC power supply ($V_{in}$) supplied a set voltage (which had a corresponding current $I_{in}$) to transmitter module that converted the DC power to AC in a commercially available, copper induction coil; (2) The AC power was then transferred wirelessly to an MXene coil and fed through a full bridge rectifier, after the rectification the voltage and current were then measured as $V_{out}$ and $I_{out}$.

It can be appreciated that, as the number of passes continues to build up the deposition of MXene ink composition, each strand in the coil becomes capable of greater performance. A first graph 610 in FIG. 6 depicts the relationship between the number of passes across four versions of the same coil assembly and their voltage capacities. A second graph 620 depicts the relationship between the number of passes across four versions of the same coil assembly and their current transmission capacities. A third graph 630 depicts the relationship between the number of turns across four versions of the same coil assembly and their overall percent efficiency. Referring to the first graph 610, it can be observed that as the number of passes increased, there was a generally increased capacity of the printed component to pass DC voltage in→DC voltage out. Although the change was not significant between one pass, three passes, and five passes, and in fact there appears to be some overlap, when ten passes were printed, the voltage out is significantly greater. Similarly, referring to the second graph 620, it can be observed that, to a certain extent, as the number of passes was increased, the capacity of the printed component to carry current based on voltage in was improved. There is also a significant jump in performance from five passes to ten passes. For example, at five passes, the current out remains relatively low (under 1100 micro-amps) even as voltage in is increased to eight and higher. There is a more profound linear relationship when the passes are doubled, whereby ten turns lead to a radical shift relative to passes of five or less. At ten passes, the performance rises quickly, providing current out values above 3000 microamps as the voltage in passes eight volts. Thus, while there is a small effect on voltage out (first graph 610), current trans-mission is actually highly dependent on the number of passes (e.g., as resistance decreases). Indeed, although not shown here, additional testing also showed that as the coil print was deposited at 20 passes, the current out approached one milliamp, underlining the effect of number of passes on reducing resistance.

Finally, referring to the third graph 630, it can be observed that as the number of passes was increased, the overall efficiency of the component was consistently improved. For example, at one, two and five passes, the efficiency value gradually rises. There is a more profound upturn, similar to that shown in second graph 620, when the passes are doubled (ten passes) that lead to a significant jump in the efficiency that is measured. More specifically, between volt-age in of around six volts and voltage in of around six and a half volts, there is a striking increase in efficiency. Thus, as a general matter, the greater the number of passes, the better the performance of the coil, for example in powering a battery or other application.

Figure 7:
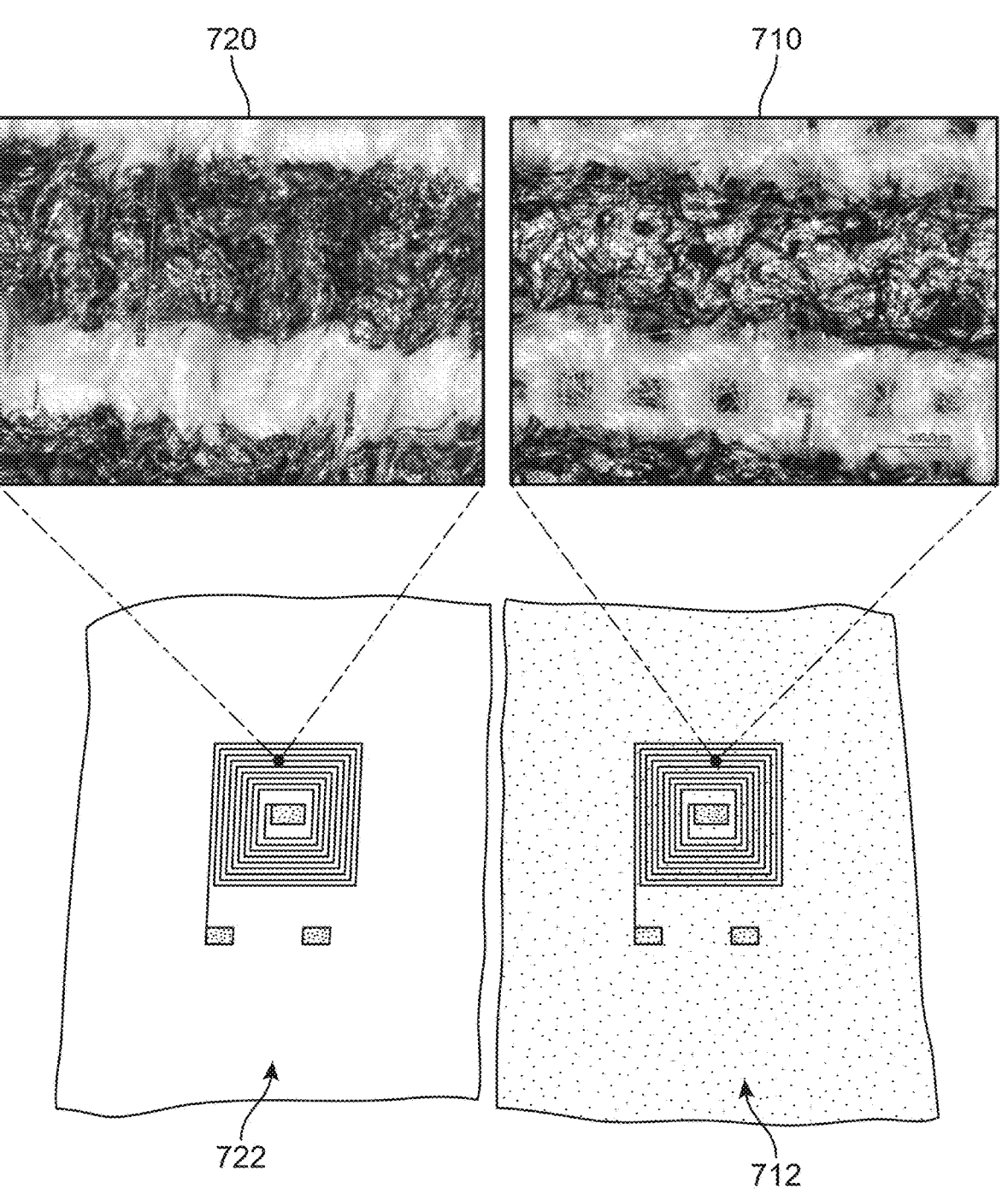
FIG. 7 presents two images of sample textile substrates on which coils are fabricated via printing techniques, according to an embodiment.

Moving now to FIG. 7, two photographs are provided to better demonstrate the wide applicability of the proposed manufacturing techniques across a diverse range of fabrics. In FIG. 7, two different fabrics including Turkish cotton and International Standard Organization (ISO) adjacent cotton were augmented with MXene components via direct print-ing. While as a general matter performance can vary based on surface roughness, hydrophobicity, stretchiness and thickness of the textile, it can be appreciated that the printed coil is functional in both cases. With respect to a first image 710 showcasing the printed product on ISO adjacent cotton fabric (hydrophobic), a resultant first coil assembly 712 is distinct and has better definition with little roughness. In a second image 720 showcasing the printed product on a woven Turkish cotton (hydrophilic), a resultant second coil assembly 722 has relatively lower definition but better mechanical behavior. In this comparison, the cotton served as a better substrate in terms of improved adhesion with the ink due to its hydrophilicity. However, it should be under-stood that while each coil is printed on substrates with different physical characteristics and properties, they each provide working functionality. In addition, after being washed, the augmented fabrics retained their functionality and continued to offer robust energy transferability. Further-more, the augmented e-textiles were tested and the MXene wireless charging printed coil was successfully used to power a standard off-the-shelf microcontroller.

Figure 8:
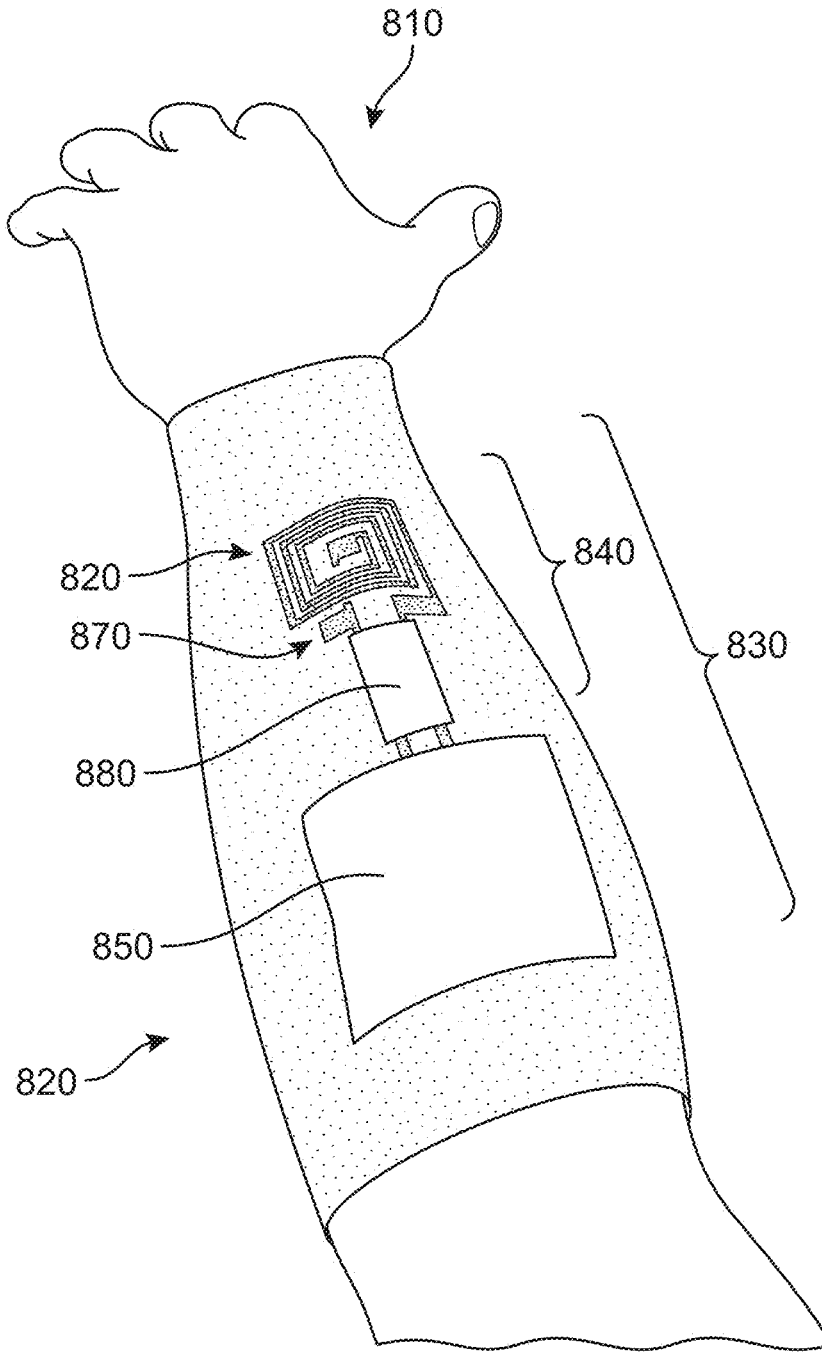
FIG. 8 illustrates an example of a wearable garment in which a printed wireless electronic has been embedded, according to an embodiment.

In different embodiments, the proposed printed compo-nents and augmented e-textiles can incorporate additional provisions for integration into the textile experience. For example, one implementation is illustrated in FIG. 8, com-prising an augmented e-armband ("armband") 820. The armband 820 is depicted as worn by a user 810, and so must be stretched and conform to the user's arm while remaining comfortable and providing the desired functionalities. In this example, armband 820 includes an apparatus 830 including a first assembly 840 and a second assembly 850. A printed MXene wireless charging coil 860, two MXene textile-based supercapacitors 870, and a connector portion 880

(e.g., conductive yarns as interconnects) collectively com-prise first assembly 840. In some embodiments, the super-capacitors can be added to the textile as patches that are attached via adhesive. The first assembly 840 can be further connected to and power the second assembly 850, which can include a microcontroller and peripherals with pins, shown here as a nondescript package for purposes of simplicity. The first assembly 840 can thereby be used to directly power the microcontroller, and enable the operation of sensors and/or data transmission from the e-textile storage to other devices (e.g., smartphones).

As a general matter, the packaging of various components in association with the printed elements was shown to have no negative effect, and indeed offered some small improve-ments in performance of powering of the microcontroller. In addition, it can be appreciated that in some embodiments, the printed components can be integrated into a textile patch that can be ironed-on or otherwise integrated into the desired substrate post-production to allow for the custom augmen-tation of consumer garments apparel and reduce interfer-ence. In one test, the coil was printed on one side of an iron-on patch, and power transfer was successful from the coil to the test device (e.g., an LCD watch) through the patch itself, with no loss to efficiency, and a higher voltage and current output. One depiction of this patch was presented in FIG. 1 as textile supercapacitor 130. In this example, a 3" by 6" patch comprised a set of three cells in series, and non-woven cotton was coated with the MXene ink compo-sition. A non-woven cotton separator was disposed between with LiCl PVA gel (in this case, 5 M in 10:1, H2O:PVA), and the textile "patch" as packaging material. In some embodi-ments, graphene with a Kapton backing can be used for the interconnect.

As described herein, the proposed techniques and systems can support a wide range of applications, such as wireless charging for clothing and wearables, power supply for health monitoring, charging of e-textiles while hanging to provide power to activity tracking in a shirt or other garment, wireless monitoring and data transmission of baby or patient health signals while sleeping using an augmented e-textile sheet on the bed and/or an augmented e-textile onesie, wireless charging and data transfer from clothing to devices or sensors, charging of phones, health monitoring including functionalized body limb wraps, monitors for muscle motion, and skin-based sensors, and even wireless charging and data transfer for furniture with embedded devices or electronics such as a couch, chair, baby crib, child car seat, or bed, and textiles such as curtains, carpets, blankets, tents/canopies. Such an on-garment energy grid/wireless charging coil system based on MXene printed coils can further be used to fabricate "smart" garments such as a smart shirt with embedded sensing for physical activity (e.g., heart rate, movement, body temperature, etc.) that can be wire-lessly charged prior to a workout and after a workout be recharged, allowing the wearer to collect health data that is wirelessly transferred through the same wireless charging coil to their phone with performance upward of 40 milli-amps DC current.

Figure 9:
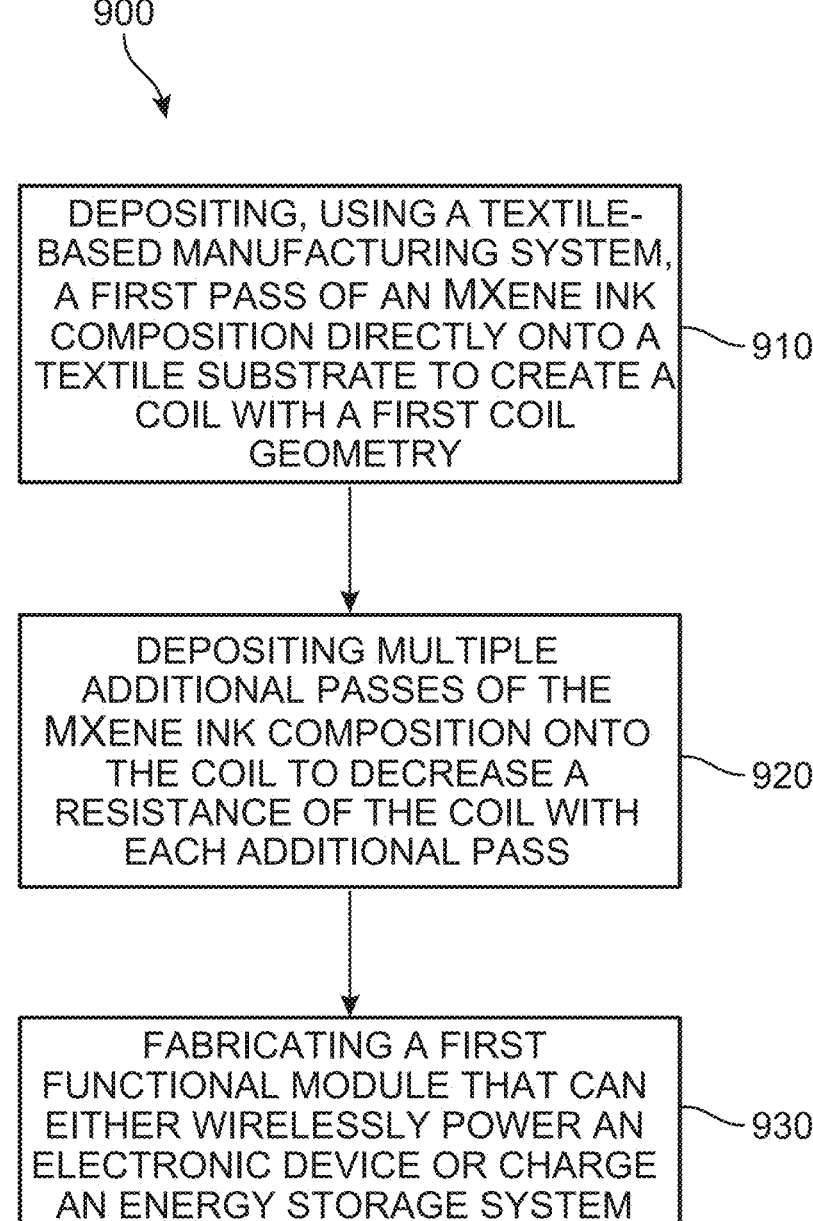
FIG. 9 is a flow chart depicting a method of manufacturing flexible wireless electronics on textiles, according to an embodiment.

FIG. 9 is a flow chart illustrating an embodiment of a method 900 of manufacturing flexible wireless electronics on textiles. The method 900 includes a first operation 910 of depositing, using a textile-based manufacturing system, a first pass of an MXene ink composition directly onto a first textile substrate to create a coil with a first coil geometry, and a second operation 920 of depositing multiple additional passes of the MXene ink composition onto the coil to decrease a resistance of the coil with each additional pass. In addition, a third operation 930 includes thereby fabricating a first functional module that can either wirelessly power an electronic device, charge an energy storage system, or provide wireless data transfer to an electronic device.

In other embodiments, the method may include additional steps or aspects. In different embodiments, the manufacturing system is one of a screen printer, embroiderer, knitter, sprayer, stencil, and direct ink write printer. In some embodiments, the first textile substrate is a part of a garment or article of apparel. In one embodiment, a shape associated with the coil geometry is a two-dimensional planar pattern that supports the magnetic coupling of energy. In some embodiments, a material of the first textile substrate is one of an organic fabric, a synthetic fabric, and a flexible polymer substrate. In some embodiments, the material of the first textile substrate is an organic fabric, such as ISO adjacent cotton. In another embodiment, the material of the first textile substrate includes synthetic fabrics as well as flexible polymer substrates. In some embodiments, the material of the first textile substrate includes one or more polymer substrates such as PET, Kapton, and TPU.

The proposed embodiments also describe a wearable device that serves as a wireless charging coil, sensor, or energy storage system. The wearable device includes a first textile substrate; and an MXene ink composition printed onto the first textile substrate having a coil geometry which includes at least two coil loops, and one or more printing passes. In other embodiments, the device may include additional features or aspects. In different embodiments, the coil geometry includes at least 10 coil loops. In some embodiments, the coil geometry includes at least 14 coil loops. In another embodiment, the MXene ink composition is printed onto the first textile substrate via one of a screen printer, stencil, and direct ink write printer. In some embodiments, the MXene ink composition is used to either wirelessly power an electronic device or charge an energy storage system. In one embodiment, the first textile substrate is a part of a garment or an article of apparel. In some embodiments, the first textile substrate is one of an organic fabric, a synthetic fabric, and a flexible polymer substrate. In another embodiment, a shape associated with the coil geometry is a two-dimensional planar pattern that supports the magnetic coupling of energy.

As another example, the proposed embodiments also describe an e-textile garment that enables wearers to wirelessly power an electronic device or charge an energy storage system. The e-textile garment includes a first textile substrate; and an MXene ink composition printed onto the first textile substrate having a coil geometry which includes at least two coil loops, and one or more printing passes. In other embodiments, the device may include additional features or aspects. In different embodiments, the coil geometry includes at least 3 printing passes. In some embodiments, the coil geometry includes at least 20 printing passes. In one embodiment, the MXene ink composition is printed onto the first textile substrate via one of a screen printer, stencil, and direct ink write printer. In some embodiments, a shape associated with the coil geometry is a two-dimensional planar pattern that supports the magnetic coupling of energy. In another embodiment, the first textile substrate is a part of a garment or an article of apparel. In some embodiments, the first textile substrate is one of an organic fabric, a synthetic fabric, and a flexible polymer substrate The examples described herein show only some of many possible different implementation contexts. In that respect, the technical solutions are not limited in their application to the architectures and systems shown in the drawings, but are applicable to many other implementations, architectures, and processing.

It should be understood that the text, images, and specific application features shown in the figures are for purposes of illustration only and in no way limit the manner by which the device may be arranged. In other words, the figures present only one possible layout of the system, and do not in any way limit the presentation arrangement of any of the disclosed features.

Embodiments may include a non-transitory computer-readable medium (CRM) storing software comprising instructions executable by one or more computers or device processors which, upon such execution, cause the one or more computers or device processors to perform aspects of the disclosed methods. Non-transitory CRM may refer to a CRM that stores data for short periods or in the presence of power such as a memory device or Random Access Memory (RAM). For example, a non-transitory computer-readable medium may include storage components, such as, a hard disk (e.g., a magnetic disk, an optical disk, a magneto-optic disk, and/or a solid state disk), a compact disc (CD), a digital versatile disc (DVD), a floppy disk, a cartridge, and/or a magnetic tape.

To provide further context, in some embodiments, some of the processes described herein can be understood to operate in a system architecture that can include a plurality of virtual local area network (VLAN) workstations at different locations that communicate with a main data center with dedicated virtual servers such as a web server for user interfaces, an app server for data processing, a database for data storage, etc. As a general matter, a virtual server is a type of virtual machine (VM) that is executed on a hardware component (e.g., server). In some examples, multiple VMs can be deployed on one or more servers.

In addition, the dynamic print system can include one or more devices capable of receiving, generating, storing, processing, and/or providing information, such as information described herein. For example, dynamic print system may include one or more computing devices, such as one or more server devices, desktop computers, workstation computers, virtual machines (VMs) provided in a cloud computing environment, or similar devices. The systems can exchange information over one or more wired and/or wireless networks. For example, networks may include a cellular network, a public land mobile network (PLMN), a local area network (LAN), a personal area network (PAN) such as Bluetooth, a wide area network (WAN), a metropolitan area network (MAN), a telephone network (e.g., the Public Switched Telephone Network (PSTN)), an ad hoc network, an intranet, the Internet, a fiber optic-based network, a cloud computing network, a private network, and/or a combination of these or other types of networks.

Other systems, methods, features, and advantages of the disclosure will be, or will become, apparent to one of ordinary skill in the art upon examination of the following figures and detailed description. It is intended that all such additional systems, methods, features, and advantages be included within this description and this summary, be within the scope of the disclosure, and be protected by the following claims.

While various embodiments are described, the description is intended to be exemplary, rather than limiting and it will be apparent to those of ordinary skill in the art that many more embodiments and implementations are possible that are within the scope of the embodiments. Although many possible combinations of features are shown in the accompanying figures and discussed in this detailed description, many other combinations of the disclosed features are possible. Any feature or element of any embodiment may be used in combination with or substituted for any other feature or element in any other embodiment unless specifically restricted.

This disclosure includes and contemplates combinations with features and elements known to the average artisan in the art. The embodiments, features and elements that have been disclosed may also be combined with any conventional features or elements to form a distinct invention as defined by the claims. Any feature or element of any embodiment may also be combined with features or elements from other inventions to form another distinct invention as defined by the claims. Therefore, it will be understood that any of the features shown and/or discussed in the present disclosure may be implemented singularly or in any suitable combination. Accordingly, the embodiments are not to be restricted except in light of the attached claims and their equivalents. Also, various modifications and changes may be made within the scope of the attached claims.

While various embodiments of the invention have been described, the description is intended to be exemplary, rather than limiting, and it will be apparent to those of ordinary skill in the art that many more embodiments and implementations are possible that are within the scope of the invention. Accordingly, the invention is not to be restricted except in light of the attached claims and their equivalents. Also, various modifications and changes may be made within the scope of the attached claims.

We claim:

1. A wearable device that serves as a wireless charging coil, sensor, or energy storage system, the wearable device comprising:
  a first textile substrate; and
    an MXene ink composition printed onto the first textile substrate having a coil geometry which includes at least two coil loops, and one or more printing passes, wherein the at least two coil loops comprise a primary coil and a secondary coil, wherein the secondary coil is a printed landing pad that is connected via a MXene-coated yarn to the primary coil.

2. The wearable device of claim 1, wherein the coil geometry includes at least 10 coil loops.

3. The wearable device of claim 1, wherein the coil geometry includes at least 14 coil loops.

4. The wearable device of claim 1, wherein the MXene ink composition is printed onto the first textile substrate via one of a screen printer, stencil, and direct ink write printer.

5. The wearable device of claim 1, wherein the MXene ink composition is used to either wirelessly power an electronic device or charge an energy storage system.

6. The wearable device of claim 1, wherein the first textile substrate is a part of a garment or an article of apparel.

7. The wearable device of claim 1, wherein the first textile substrate is one of an organic fabric, a synthetic fabric, and a flexible polymer substrate.

8. The wearable device of claim 1, wherein a shape associated with the coil geometry is a two-dimensional planar pattern that supports the magnetic coupling of energy.

9. An e-textile garment that enables wearers to wirelessly power one or more electronic devices or to charge an energy storage system, the e-textile garment comprising:
  a first textile substrate; and
    an MXene ink composition printed onto the first textile substrate having a coil geometry which includes at least two coil loops, and one or more printing passes, wherein the at least two coil loops comprise a primary coil and a secondary coil, wherein the secondary coil is a printed landing pad that is connected via a MXene-coated yarn to the primary coil.

10. The e-textile garment of claim 9, wherein the coil geometry includes at least 3 printing passes.

11. The e-textile garment of claim 9, wherein the coil geometry includes at least 20 printing passes.

12. The e-textile garment of claim 9, wherein the MXene ink composition is printed onto the first textile substrate via one of a screen printer, stencil, and direct ink write printer.

13. The e-textile garment of claim 9, wherein a shape associated with the coil geometry is a two-dimensional planar pattern that supports the magnetic coupling of energy.

14. The e-textile garment of claim 9, wherein the first textile substrate is a part of a garment or an article of apparel.

15. The e-textile garment of claim 9, wherein the first textile substrate is one of an organic fabric, a synthetic fabric, and a flexible polymer substrate.

16. The wearable device of claim 1, wherein a first pitch of the primary coil is greater than a second pitch of the secondary coil.

17. The wearable device of claim 1, wherein a shape of the at least two coil loops are, rectangles or rectangular with rounded edges, wherein each of the at least two coil loops has a first maximum length L1 on one side and a second maximum length L2.

18. The e-textile garment of claim 9, wherein a first pitch of the primary coil is greater than a second pitch of the secondary coil.

19. The e-textile garment of claim 9, wherein a shape of the at least two coil loops are rectangles or rectangular with rounded edges, wherein each of the at least two coil loops have a first maximum length L1 on one side and a second maximum length L2.

* * * * *